US008052795B2

(12) United States Patent
Kang et al.

(10) Patent No.: US 8,052,795 B2
(45) Date of Patent: Nov. 8, 2011

(54) CATALYST ENHANCED CHEMICAL VAPOR DEPOSITION APPARATUS AND DEPOSITION METHOD USING THE SAME

(75) Inventors: Hee-Cheol Kang, Kyunggi-do (KR); Kazuo Furuno, Kyunggi-do (KR); Han-Ki Kim, Kyunggi-do (KR); Myoung-Soo Kim, Kyunggi-do (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 13 days.

(21) Appl. No.: 11/405,552

(22) Filed: Apr. 18, 2006

(65) Prior Publication Data
US 2006/0254513 A1 Nov. 16, 2006

(30) Foreign Application Priority Data

May 13, 2005 (KR) .................. 10-2005-0040311

(51) Int. Cl.
*C23C 16/00* (2006.01)
(52) U.S. Cl. ............. 118/715; 118/723 HC; 427/255.28
(58) Field of Classification Search .................. 118/722, 118/724, 723 HC; 427/249.11; 219/390
See application file for complete search history.

(56) References Cited

U.S. PATENT DOCUMENTS

| 4,237,150 | A | | 12/1980 | Wiesmann |
| 4,970,986 | A | * | 11/1990 | Anthony et al. ............ 118/724 |
| 5,997,650 | A | * | 12/1999 | Herlinger et al. ............ 118/724 |
| 6,225,241 | B1 | | 5/2001 | Miyoshi |
| 6,513,514 | B1 | * | 2/2003 | Micheletti ....................... 125/21 |
| 6,593,548 | B2 | * | 7/2003 | Matsumura et al. .......... 219/390 |
| 6,709,512 | B2 | * | 3/2004 | Yamoto et al. .................. 117/90 |
| 2004/0065260 | A1 | * | 4/2004 | Ishibashi et al. .............. 118/724 |

FOREIGN PATENT DOCUMENTS

| JP | 04-021777 | | 1/1992 |
| JP | 2002-016003 | * | 1/2002 |
| JP | 2002-356777 | * | 12/2002 |
| JP | 2004-055651 | * | 2/2004 |

(Continued)

OTHER PUBLICATIONS

McGraw-Hill Encyclopedia of Science and Technology, 1992, article titled "Hydraulic actuator" p. 558.*

(Continued)

*Primary Examiner* — Michael Cleveland
*Assistant Examiner* — Nathan K Ford
(74) *Attorney, Agent, or Firm* — Robert E. Bushnell, Esq.

(57) ABSTRACT

A catalyst-enhanced chemical vapor deposition (CECVD) apparatus and a deposition method, in which tension is applied to a catalyst wire in order to prevent the catalyst wire from sagging due to thermal deformation, and additional gas is used to prevent foreign material from being generated. The CECVD apparatus may be constructed with a process chamber, a showerhead to introduce process gas into process chamber, a tensile catalyst wire structure provided in the process chamber to decompose the gas introduced from the showerhead, and a substrate on which the gas decomposed by the catalyst wire structure is deposited, so that the tension is applied to a catalyst wire in order to prevent the catalyst wire from sagging due to thermal deformation, and additional gas is used to prevent foreign material from being generated, thereby eliminating occurrences of non-uniform temperatures of a substrate and non-uniform film growth, and concomitantly enhancing the durability of the catalyst wire.

27 Claims, 7 Drawing Sheets

FOREIGN PATENT DOCUMENTS

JP    2004-107766    4/2004
JP    2005-281776    10/2005

OTHER PUBLICATIONS

*Search report* from the Taiwanese Intellectual Property Office issued in Applicant's corresponding Taiwanese Patent Application 095113716 dated Apr. 1, 2006.

*Office action* from the Japanese Patent Office issued in Applicant's corresponding Japanese Patent Application 2005-359323 dated Oct. 28, 2008.

Korean Office Action of the Korean Patent Application No. 2005-40311, issued on Jul. 14, 2006.

* cited by examiner

CATALYST ENHANCED CHEMICAL VAPOR DEPOSITION APPARATUS AND DEPOSITION METHOD USING THE SAME

CLAIM OF PRIORITY

This application makes reference to, incorporates the same herein, and claims all benefits accruing under 35 U.S.C. §119 from an application for CATALYST ENHANCED CHEMICAL VAPOR DEPOSITION APPARATUS AND DEPOSITION METHOD USING THE SAME, earlier filed in the Korean Intellectual Property Office on the 13 May 2005 and there duly assigned Serial No. 10-2005-0040311.

BACKGROUND OF THE INVENTION

1. Technical Field

The present invention relates to a catalyst-enhanced chemical vapor deposition (CECVD) apparatus and a deposition method using the same and, more particularly, to a CECVD apparatus and a deposition method using the same, in which tension is applied to a catalyst wire in order to prevent the catalyst wire from sagging due to thermal deformation, and additional gas is used to prevent foreign material from being generated.

2. Related Art

For fabricating either a semiconductor device or, a display device, a chemical vapor deposition (CVD) method has been widely used as one of the processes for forming a predetermined thin film on a substrate.

Chemical vapor deposition processes include a plasma enhanced chemical vapor deposition (PECVD) method that grows a film by decomposing and/or activating a source gas in plasma, and a thermal chemical vapor deposition method that grows a film by heating a substrate and causing a chemical reaction with the heat of the substrate. Besides these, there is a CVD method that grows a film by decomposing and/or activating a source gas using a heating element to maintain a predetermined high temperature, which is called a "heating element CVD method".

With the film growth processing apparatus used in the heating element CVD method, a source gas is introduced while a heating element made of a high melting point metal such as tungsten or the like is maintained at a high temperature of approximately 1,000° C.~2,000° C. inside a vacuum chamber. The source gas introduced is decomposed or activated when it passes through the surface of the heating element. Finally, the decomposed or activated source gas arrives at a substrate, so that a thin film is deposited on the surface of the substrate. In particular, the heating element CVD method employing a heating element shaped like a wire is also called a "hot wire CVD method". Further, a heating element CVD method employing a catalytic reaction with the heating element to decompose or activate the source gas is called a "catalyst enhanced chemical vapor deposition (CECVD) method".

In the CECVD method, the source gas is decomposed, or activated, when it passes through the surface of the catalyst, so that the temperature of the substrate may be advantageously lowered during the process as compared with the thermal chemical vapor deposition method that uses only the heat of the substrate to cause the chemical reaction. Further, unlike the PECVD method the CECVD method uses no plasma, so that the substrate is prevented from being damaged due to the plasma. Thus, the CECVD method is expected as a film growth method which is particularly applicable to the manufacture of the next generation of semiconductor devices, the next generation display devices, and the like which have high integration, high performance, and a fine pitch.

SUMMARY OF THE INVENTION

Accordingly, it is an aspect of the present invention to provide an improved catalyst-enhanced chemical vapor deposition (CECVD) apparatus and deposition process.

It is another object to provide a CECVD apparatus and a deposition method using the same, in which tension is applied to a catalyst wire in order to prevent the catalyst wire from sagging due to thermal deformation, and additional gas is used to prevent foreign material from being generated.

The forgoing and/or other aspects of the present invention are achieved by providing a CECVD apparatus that may be assembled with a process chamber; a showerhead to introduce process gas into process chamber; a tensile catalyst wire structure provided in the process chamber to decompose the gas introduced from the showerhead; and a substrate on which the gas decomposed by the catalyst wire structure is deposited.

According to an aspect of the invention, the catalyst wire structure may be constructed with a catalyst wire; a plurality of tensioners connected to the catalyst wire and applying tension to the catalyst wire; a supporter that holds the tensioners; and a power supply unit supplying electric power to the catalyst wire.

According to an aspect of the invention, the tensioners may be constructed with a main body supported by the supporter; a piston unit having a piston accommodated in the main body, and a piston shaft partially penetrating the main body and having an end connected to the catalyst wire; and an elastic member accommodated in the main body and used to apply tension to the catalyst wire connected to the piston shaft of the piston unit.

According to an aspect of the invention, the main body and the supporter may be formed as a single body. Further, the main body may be internally formed with a stepped part to support the piston of the piston unit. Also, the main body includes an insulating material.

According to an aspect of the invention, the piston unit is formed with a through hole at an end thereof to pass and connect the catalyst wire therethrough. Preferably, the through hole formed in the piston unit is tapered or rounded.

According to an aspect of the invention, the piston unit may use a gas supply line that extends axially through the piston and the piston shaft. Furthermore, a compression spring may be used as the elastic member.

According to an aspect of the invention, the power supply unit may be assembled with a power source; a cable through which the electric power is supplied from the power source; and a connection terminal connecting the cable with the catalyst wire. In this assembly, the connection terminal is provided on the supporter and includes an insulating material.

According to an aspect of the invention, the supporter may have a gas supply line to furnish the gas to the catalyst wire, and a gas inlet line.

According to an aspect of the invention, the catalyst wire that is connected to the respective tensioners in the supporter, has a ㄹ-shape.

Another aspects of the present invention can be achieved by providing a CECVD method with steps of exhausting a process chamber; introducing a process gas into the exhausted process chamber; operating a catalyst wire to react with the process gas; and depositing the process gas that reacts with the catalyst wire on a substrate located within the process chamber.

According to an aspect of the invention, the process chamber may be constructed with a CECVD apparatus employing a catalyst wire structure. Furthermore, the CECVD method may also purge the process chamber before introducing the process gas.

According to an aspect of the invention, operation of the catalyst wire contemplates heating the catalyst wire, expanding the heated catalyst wire, and applying tension to the expanded catalyst wire. Furthermore, the application of tension to the expanded catalyst wire entails an application of tension to the catalyst wire and maintenance of the catalyst wire under tension.

According to an aspect of the invention, the tension is applied to the expanded catalyst wire by a catalyst wire structure employing tensioners.

According to an aspect of the invention, the operation of the catalyst wire contemplates supplying additional gas to the catalyst wire. The additional gas may be supplied by a frame for the catalyst wire structure which is connected to a gas supply line.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
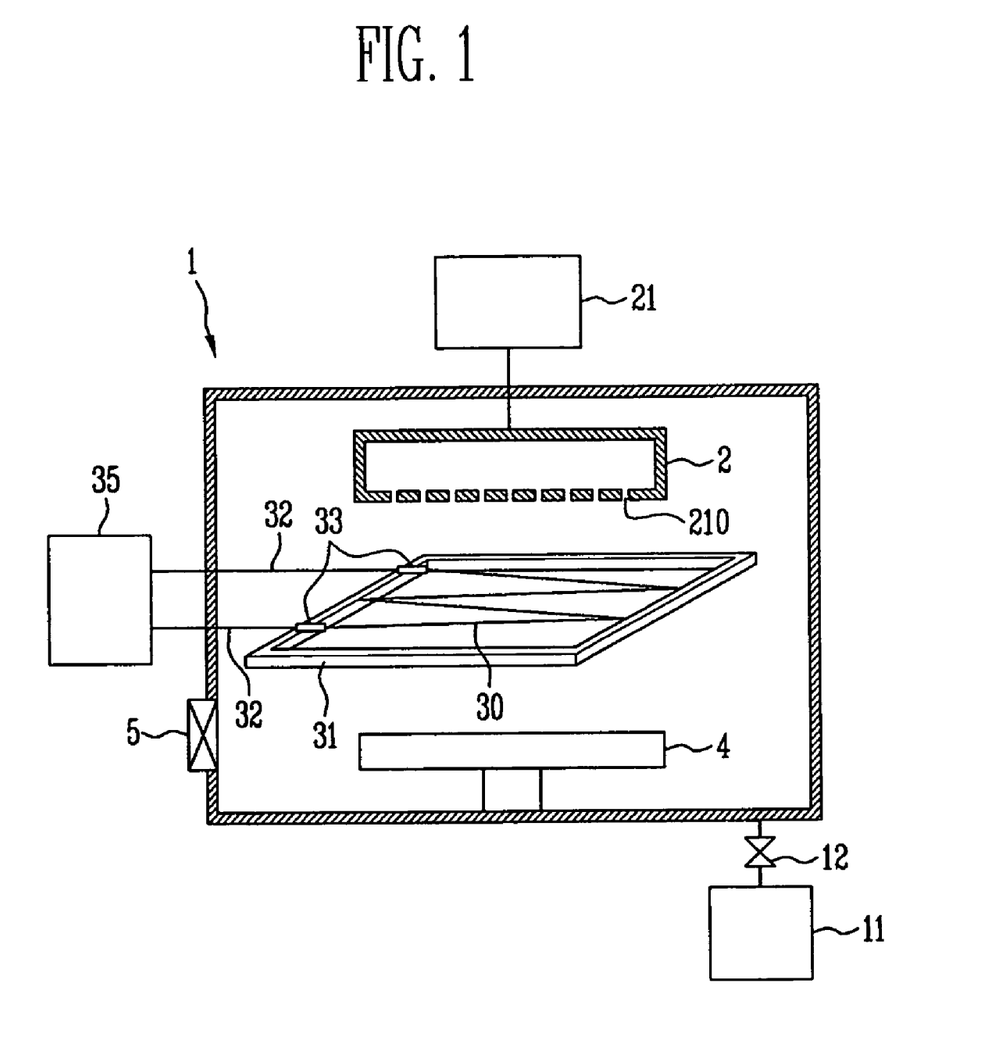
FIG. 1 is a schematic view of a conventional catalyst-enhanced chemical vapor deposition (CECVD) apparatus.

Turning now to the drawings, FIG. 1 is a schematic view of a conventional catalyst-enhanced chemical vapor deposition (CECVD) apparatus, suitable for the practice of a predetermined process for forming a thin film on a substrate (not shown) held within in an evacuated, vacuum tight chamber 1. Chamber 1 is connected with discharge system 11 to exhaust residual gasses from chamber 1 and to maintain a gas free vacuum within chamber 1, and source gas supply system 21 to supply source gas for forming the thin film to chamber 1. In chamber 1, catalyst wire 30 supported by a frame 31 is provided so that the source gas supplied to the chamber passes through the surface of catalyst wire 30. Catalyst wire 30 is connected with power supply 35 supplying electric power, so that catalyst wire 30 is heated and maintained at a predetermine temperature required for the CECVD method. Here, gas supply unit 2 is disposed facing catalyst wire 30 in chamber 1.

In chamber 1, the source gas is decomposed and/or activated by catalyst wire 30 which is maintained at a predetermined high temperature, and thus a predetermined thin film is formed as on the substrate. Therefore, chamber 1 is provided with substrate holder 4 therein to hold the substrate.

Meanwhile, reference numeral 5 indicates a gate valve to accommodate entry and exit of the substrate from chamber 1. Substrate holder 4 is typically provided with a heating unit (not shown) to heat the substrate.

In the CECVD apparatus as shown in FIG. 1, source gas supply system 21 includes a tank filled with the source gas, a supply pressure regulator, a flow adjuster, a supplying/interruption switching valve, etc., which are not shown. Thus, the source gas is supplied from source gas supply system 21 to chamber 1 through gas supply unit 2 provided inside chamber 1.

In a process of mixing two or more kinds of the source gas, two or more source gas supply systems 21 are provided for each of the several kinds of source gas and are connected to gas supply unit 2 in parallel.

Gas supply unit 2 faces catalyst wire 30 in chamber 1. Furthermore, gas supply unit 2 has a hollow structure, and has a plurality of gas injection outlet holes 210 on a surface thereof opposite to substrate holder 4.

Meanwhile, discharge system 11 is connected to chamber 1 through main valve 12 capable of adjusting discharge speed. The pressure inside chamber 1 is controlled because the main valve can adjust the discharge speed.

In the CECVED apparatus, the substrate is an objective on which a thin film will be formed. The substrate is carried in and out of chamber 1 through gate valve 5.

Catalyst wire 30 is generally shaped like a line, and wound within frame 31 in a zigzag. In this respect, catalyst wire 30 is supported by frame 31 made of an insulating material on at least one surface thereof. Also, catalyst wire 30 is connected to power supply line 32 of power supply unit 35 through connection terminal 33. Catalyst wire 30 receives power through power supply line 32 and connection terminal 33, thereby heating and maintaining the substrate at a predetermined temperature.

Generally, power supply unit 35 supplies direct current (DC) power or alternating current (AC) power. Catalyst wire 30 is heated to have a predetermined high temperature by ohmic heating, and thus the source gas decomposes and is activated, thereby efficiently growing a film.

Catalyst wire 30 should be made of high fusion point metal such as tungsten because catalyst wire 30 is heated to have a predetermined temperature by the ohmic heating.

In the CECVD apparatus shown in FIG. 1, cases of forming a silicon thin film and a silicon nitride thin film will be described by way of example.

In the case of a silicon thin film, a mixed gas of silane ($SiH_4$) and hydrogen ($H_2$) is used as the source gas. In the case of a silicon nitride thin film, a mixed gas of silane ($SiH_4$) and ammonia ($NH_3$) is used as the source gas. At this time, chamber 1 has a pressure of about 0.1 through 100 Pa. Furthermore, catalyst wire 30 is set to have a predetermined temperature, i.e., a temperature of approximately about 1,600 through 2,000° C. Furthermore, the substrate supported by substrate holder 4 is set to have a temperature of about 200 through 250° C. by a heating element (not shown).

Figure 2:
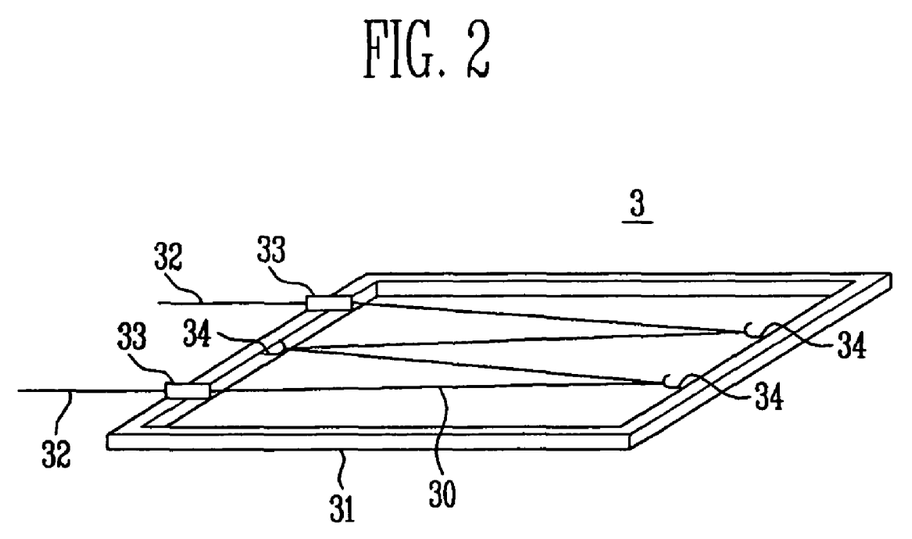
FIG. 2 is a perspective view illustrating a catalyst wire structure of the conventional CECVD apparatus illustrated in FIG. 1.

FIG. 2 is a perspective view schematically illustrating a catalyst wire structure of the conventional CECVD apparatus.

Figure 3:
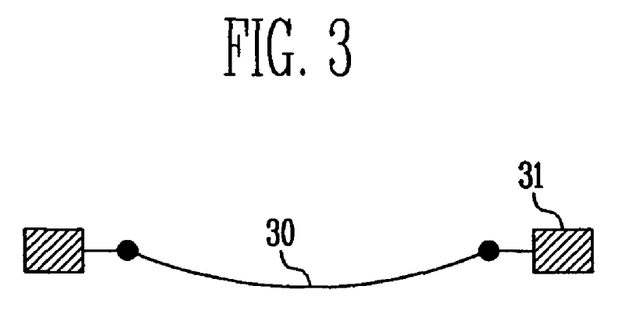
FIG. 3 shows the sag of a catalyst wire used in the conventional CECVD apparatus of FIG. 1.

Catalyst wire structure 3 is generally heated to have a high temperature, so that catalyst wire 30 thermally expands, and thus sags; the sag is schematically illustrated in FIG. 3.

The catenary of the sag in catalyst wire 30 is pronounced at greater distances from frame 31. In other words, catalyst wire 30 sags more the closer it moves toward the center of catalyst wire structure 3, so that radiant heat generated by catalyst wire 30 is not uniformly transferred across the width and breath of the entire area of the substrate.

Furthermore, sagging catalyst wire 30 has an adverse effect on gas decomposition on the process, thereby deleteriously affecting the uniformity of the deposited thin film.

Also, when the temperature is lowered in a connection between catalyst wire 30 and frame 31, a foreign material will be created around catalyst wire 30, thereby causing damage and lowering the durability of catalyst wire 30.

Exemplary embodiments of the present invention will now be described in detail with reference to the accompanying drawings.

Figure 4A:
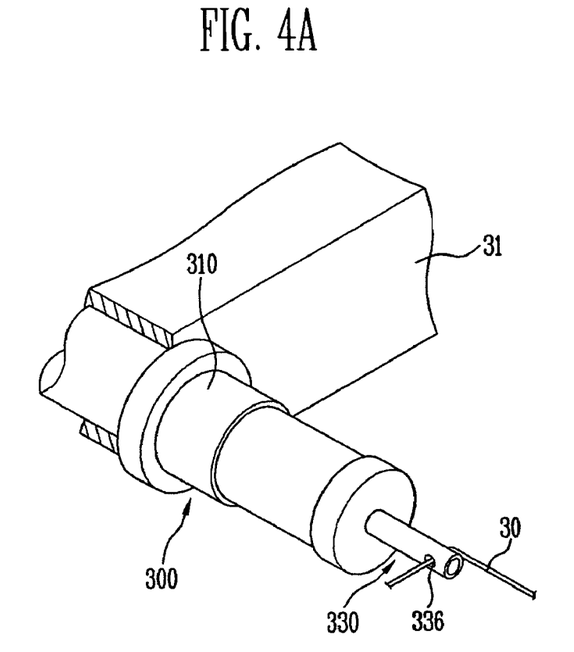
FIGS. 4A and 4B are respectively, a perspective view and a cut-away perspective view of tensioners for a catalyst wire of a catalyst wire structure in a CECVD apparatus constructed as one embodiment according to the principles of the present invention.
Figure 4B:
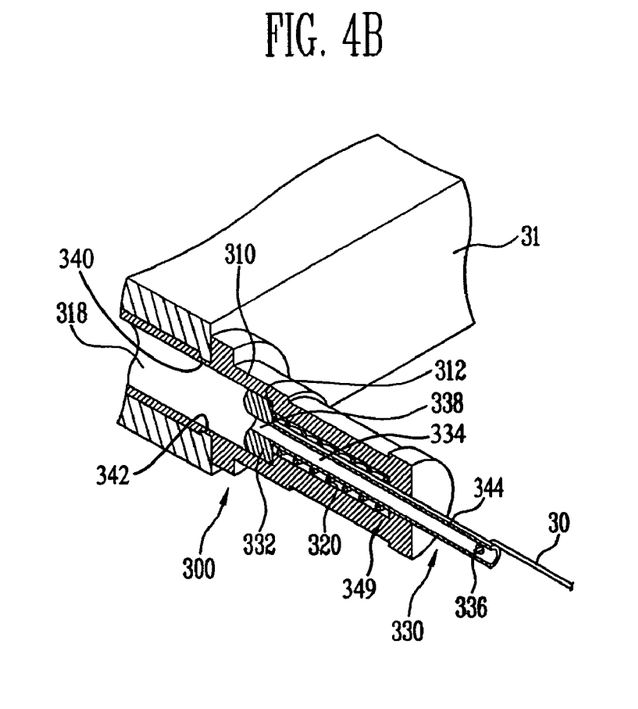

FIGS. 4A and 4B are a perspective view and a cross-sectional perspective view, respectively, of tensioners 300 dedicated to maintain a catalyst wire 30 of a catalyst wire structure in a CECVD apparatus constructed as one embodiment according to the principles of the present invention.

Tensioners 300 according to this embodiment of the present invention include main body 310 supported by frame 31; piston unit 330 having piston 332 accommodated in main body 310, and piston shaft 334 partially penetrating main body 310; and elastic member 320 accommodated in main body 310 and used in applying tension to catalyst wire 30 connected to piston shaft 334 of piston unit 330.

Main body 310 of tensioners 300 for catalyst wire 30 is firmly supported by frame 31 with a circumferential ridge 340 extending radially inwardly to retentively engage a conforming circumferential groove 342 around the exterior cylindrical surface of main body 310. In this regard, main body 310 can be made of the same material as frame 31. Alternatively, main body 3310 can be made of a material having higher electrical insulating properties than frame 31. In another embodiment, main body 310 and frame 31 may be formed as a single body. Also, main body 310 is formed with gas supply line 318 through which gas passes. In this regard, gas supply line 318 supplies the gas to catalyst wire 30 via piston unit 330 (to be described later).

Meanwhile, step 312 is formed in the internal axially extending bore through main body 310, in more detail, in the bore forming gas supply line 318 through main body 310, so that piston 332 of piston unit 330 is supported by step 312 and, when supported by step 312, applies the minimum tension to catalyst wire 30 connected to piston shaft 334.

Piston unit 330 is reciprocatingly accommodated within the axially extending bore perforating main body 310 of tensioner 300. Piston unit 330 includes piston 332 and piston shaft 334. In this regard, piston 332 is entirely accommodated in main body 310, and piston shaft 334 extends from piston 332 in a direction perpendicularly away from frame 31 supporting main body 3 10. A free distal end 344 of piston shaft 334 extending from piston 332 is exposed to the outside of main body 310. In this respect, piston 332 and piston shaft 334 may be formed as a single body or may be formed as cooperating bodies that are separable from each other.

Furthermore, piston unit 330 is formed with a central, axially extending bore that forms gas supply line 338 through which the gas is supplied from piston 332 to piston shaft 334. Gas supply line 338 is physically connected to and communicates with gas supply line 318 formed in main body 310, so that the gas from supply 21 is supplied from gas supply line 310 to catalyst wire 30 through gas supply line 338, with that gas discharged from the orifice provided by piston shaft 334 is in substantial axial alignment with the corresponding longitudinal length of wire 30. In essence, piston 332 serves as a nozzle to discharge the source gas in close proximity to the corresponding length of wire 30.

Figure 5:
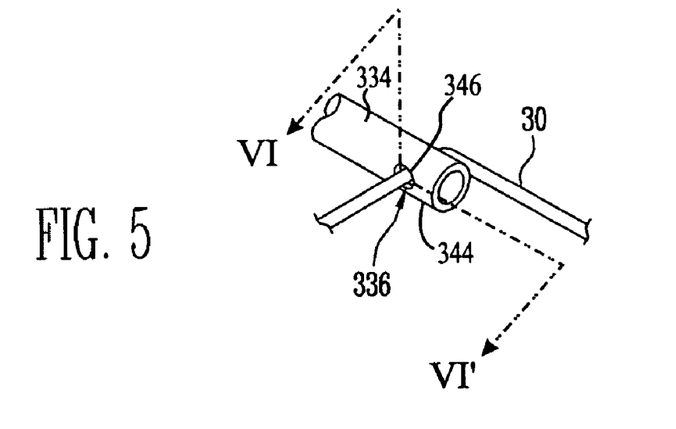
FIG. 5 is a partially enlarged perspective view showing a connecting portion of the catalyst wire of FIG. 4.

FIG. 5 is a partially enlarged perspective view showing a connecting portion formed by distal end 344 engaging and supporting a turn in catalyst wire 30 of FIG. 4.

The free end 344 of piston shaft 334, which is exposed on the outside of main body 310, is perforated by through hole 336 through which passes one turn of catalyst wire 30 in order to hold wire 30 connected to frame 31. Thus, catalyst wire 30 is connected to frame 31 with a turn, or bend, of catalyst wire 30 passing through through hole 336. At this time, the turn of catalyst wire 30 contacts the surface of through hole 336 while passing through through hole 336, so that it is preferable that piston 332 and piston shaft 334 are perforated at distal end 344 by through hole 336, and are made of an electrically insulating material. More preferably, piston unit 330 is made of the same material as main body 310 in consideration of friction that occurs during movement between an inner wall of main body 310 and piston 332.

Figure 6A:
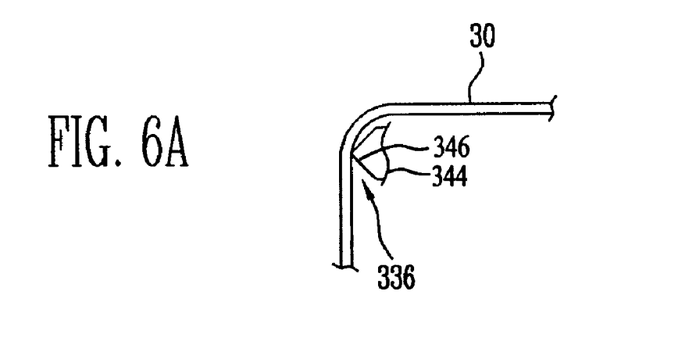
FIGS. 6A and 6B are cut-away views schematically illustrating alternative configuration on the insides of a through hole taken along sectional line VI-VI' shown by FIG. 5.
Figure 6B:
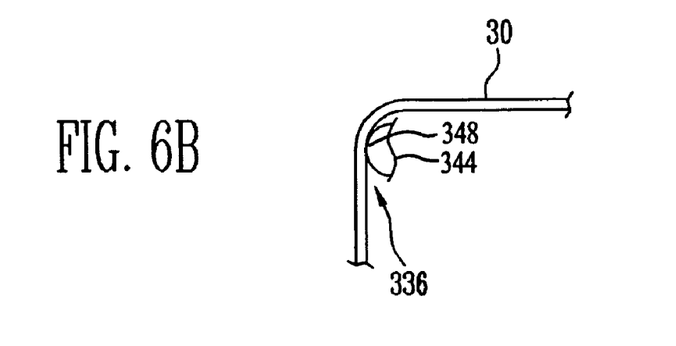

FIGS. 6A and 6B are cut-opened views schematically illustrating the portion of catalyst wire 30 at a turn inside through hole 336 illustrated in FIG. 5.

The wall thickness of through hole 336 in the hollow distal end 344 may form a tapered point of contact 346 where the periphery of through hole 336 physically engages the turn of catalyst wire 30 as illustrated by FIG. 6A, or a rounded point of contact 348 as illustrated by FIG. 6B to make a curved angle at the near the end of the turn, or bend, of catalyst wire 30 which is sufficiently gentle at the inlet of through hole 336 where catalyst wire 30 passes through through hole 336. That is, at one end of its turn, or bend, catalyst wire 30 makes a gentle, less than acute angle, so that should catalyst wire 30 become hardened due to being subjected to alternating cycles of heating and cooling wire 30 is prevented from experiencing damage at its point of contact with the wall of distal end 322.

To apply tension to each length of catalyst wire 30 connected to frame 31 by through hole 336, elastic member 320 is provided positioned within main body 310 and disposed coaxially around piston shaft 334 and is compressed between piston 332 and step 349 at the inner terminus of piston unit 330. Due to the compression, elastic member 320 additionally applies force against step 312 of piston 332 of main body 310 which forces piston 332 axially inwardly and this draws catalyst wire along its axial length toward frame 31.

Figure 7:
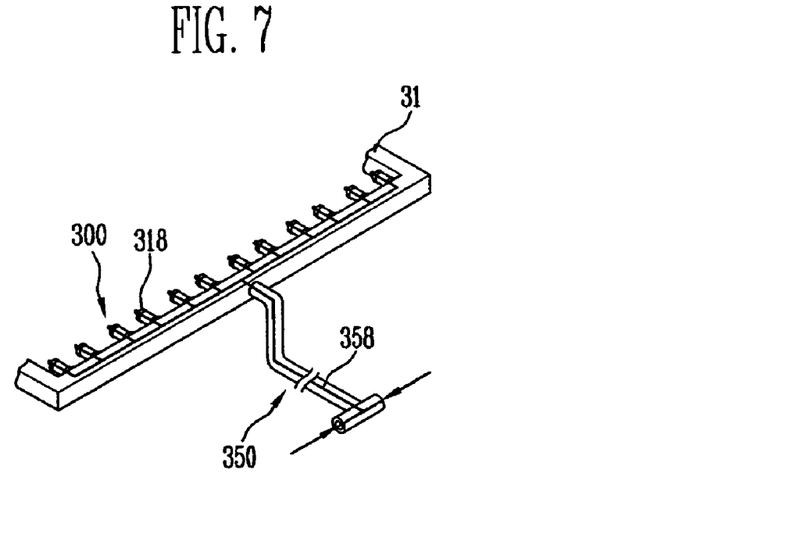
FIG. 7 is a partially cut-away perspective view of a gas supply line for the catalyst wire structure used in the CECVD apparatus constructed as one embodiment according to the principles of the present invention.
Figure 8:
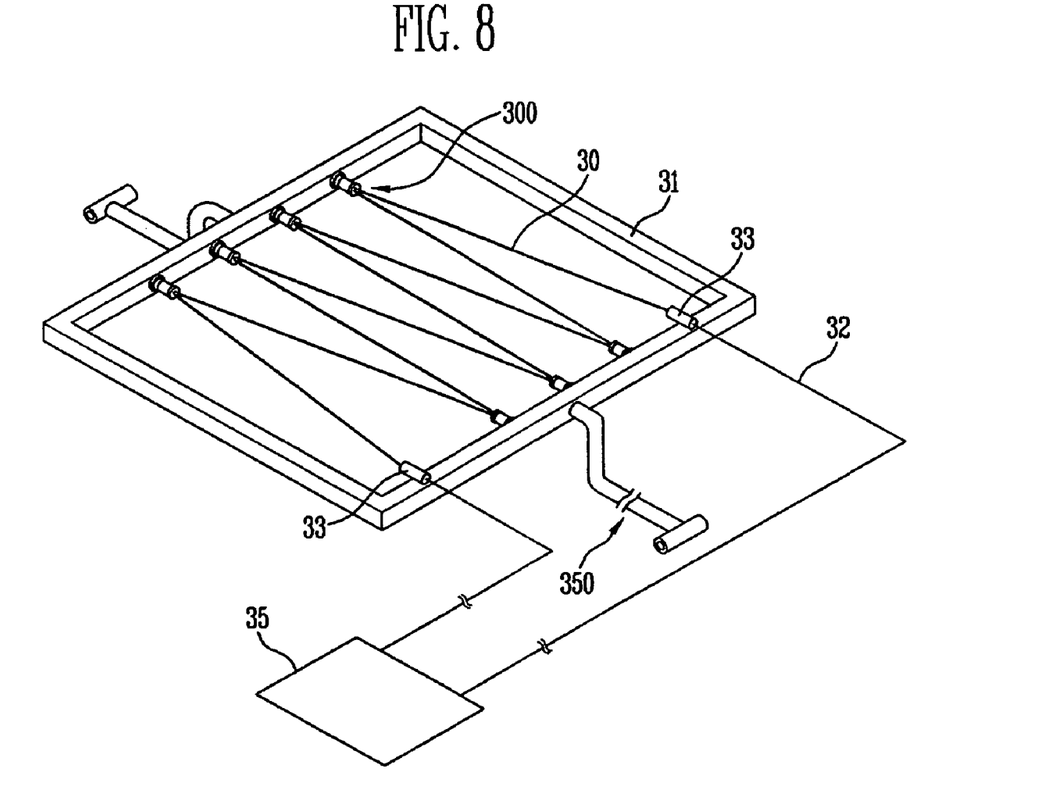
FIG. 8 is a perspective view of a catalyst wire structure for a CECVD apparatus constructed as one embodiment according to the principles of the present invention.
Figure 9:
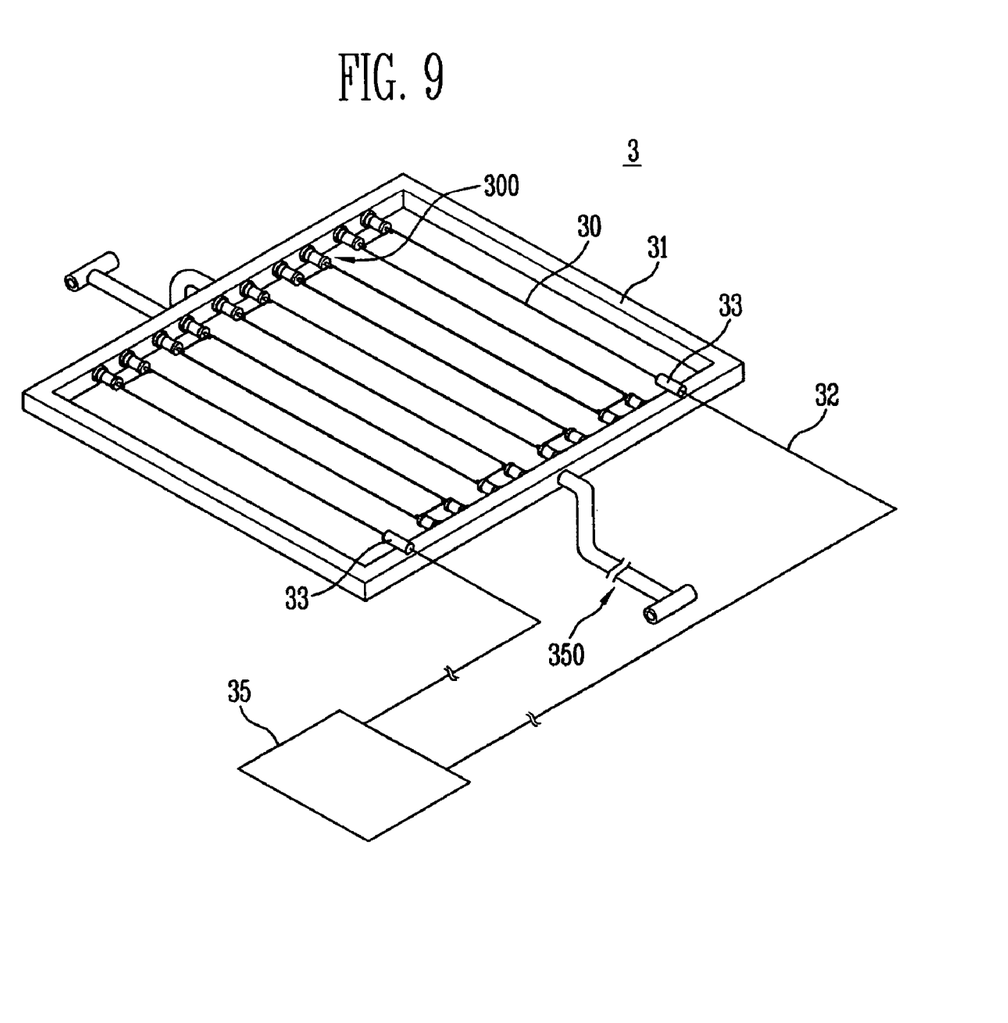
FIG. 9 is a perspective view of a catalyst wire structure for a CECVD apparatus constructed as another embodiment according to the principles of the present invention.

FIG. 7 is a partially cut-opened perspective view of a gas supply line of the catalyst wire structure incorporated into the CECVD apparatus according to one embodiment of the present invention, FIG. 8 is a perspective view of a catalyst wire structure in a CECVD apparatus according to an embodiment of the present invention, and FIG. 9 is a perspective view of a catalyst wire structure of in a CECVD apparatus according to a second embodiment of the present invention.

Catalyst wire structure 3 of the CECVED apparatus according to the first embodiment of the present invention includes catalyst wire 30; a plurality of tensioners 300 connecting the turns of wire 30 to frame 31; and power supply 35 furnishing electric power to catalyst wire 30.

Catalyst wire 30 is sequentially connected to the plurality of tensioners 300 at corresponding turns along its length. For example, catalyst wire 30 is provided as a single line and alternately connected between the plurality of tensioners 300 on opposite sides of frame 31, wherein the plurality of tensioners 300 are reciprocatingly held under tension by frame 31 while facing each other. Opposite ends of catalyst wire 30 are connected to power supply 35 and receive electric power from power supply 35.

As shown in FIG. 8, catalyst wire 30 can be string as a zigzag connected between successive tensioners 300 on opposite sides of frame 31 in the pattern of catalyst wire structure 3 shown in FIG. 2. More preferably, as shown in FIG. 9, catalyst wire 30 can be connected to tensioners 300 on frame 31, alternating between successive pairs of neighboring tensioners 300 to form a pattern having a ⊇-shape (i.e., a rectangular S-shape). The alternating connection structure of FIG. 9 is more preferable than that of FIG. 8 because the curved angle at each turn of catalyst wire 30 connected to tensioners 300 is increased with the alternating S-shape connection structure of FIG. 9 when compared with that of FIG. 8. Furthermore, although catalyst wire 30 alternates between heating and cooling processes, damage of catalyst wire 30 due to thermosetting is prevented. Meanwhile, where the point of contact 348 of through hole 336 as shown in FIGS. 6A and 6B is applied to this alternating connection structure shown in FIG. 9, other damage to catalyst wire 30 attributable to the physical contact, is more effectively decreased.

The power-supply furnishing electric power to catalyst wire 30 during the process includes power source 35; cable 32 through which the electric power is supplied from power source 35; and connection terminal 33 connecting cable 32 with catalyst wire 30. With this configuration, connection terminal 33 is preferably formed on frame 31. Connection terminal 33 is made of an electrically insulating material, so that power transmission is more efficiently performed.

Frame 31 is formed with gas supply line 358 to supply gas to catalyst wire 30 via gas inlet line 350. Gas inlet line 350 is connected to both of the opposite sides of frame 31 and subsequently to each of the plurality of tensioners 300. Gas inlet line 350 supplies gas to catalyst wire 30 separately from the process gas discharged from showerhead 2. Thus, gas is supplied from gas inlet line 350 to the plurality of tensioners 300 provided on opposite sides of frame 31 through gas supply line 358. In this respect, gas supply line 318 of main body 310 and gas supply line 338 of piston unit 330 communicate with gas supply line 358 of gas inlet line 350 via frame 31. Furthermore, the gas supplied from gas inlet line 350 to catalyst wire 30 via gas supply lines 358, 318 and 338 prevents foreign material from being formed on catalyst wire 30 as the ambient temperature is lowered due to unavoidable heat loss in a connecting region between catalyst wire 30 and tensioners 300.

Figure 10:
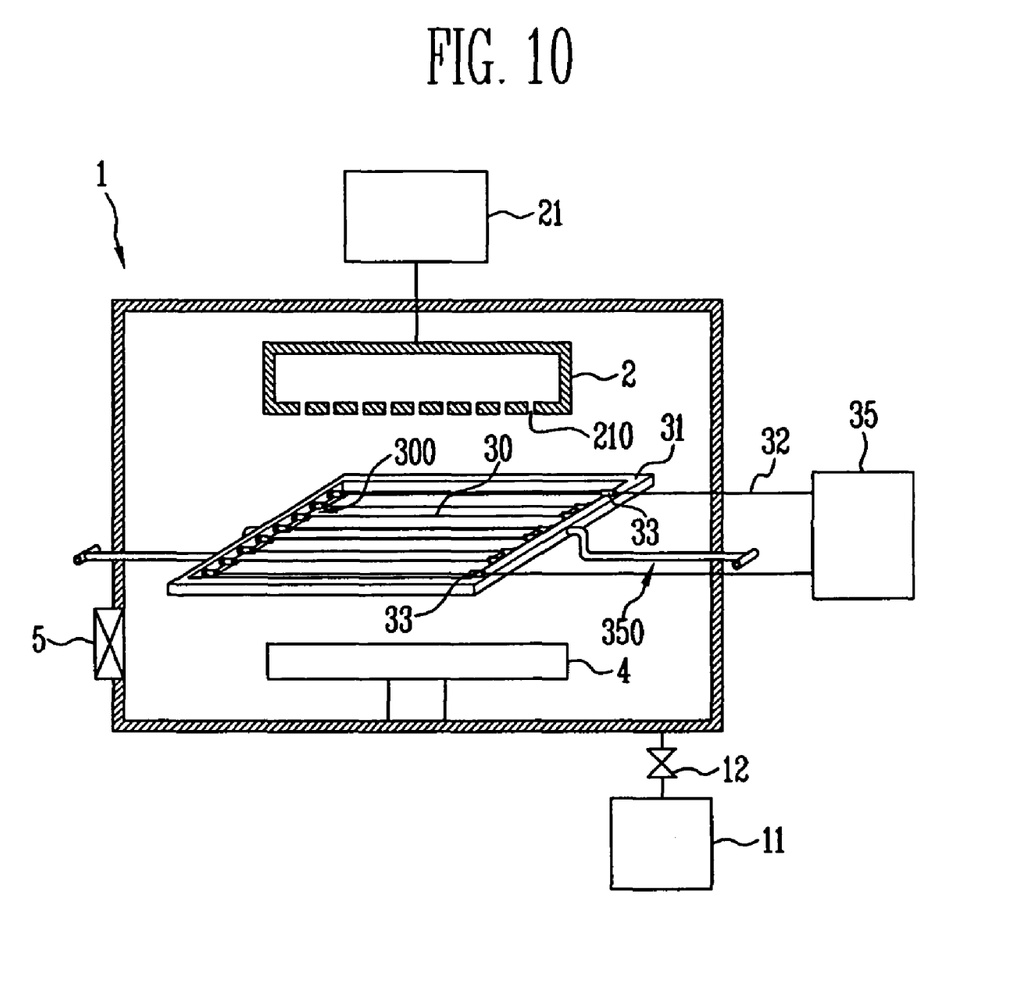
FIG. 10 is a schematic view of a CECVD apparatus equipped with a catalyst wire structure constructed as the second embodiment according to the principles of the present invention.

FIG. 10 is a schematic view of the CECVD apparatus provided with a catalyst wire structure constructed as a second embodiment of the present invention.

A CECVD apparatus according to the second embodiment of the present invention includes process chamber 1; shower head 2 to effuse process gas into process chamber 1; tensile catalyst wire structure 3 provided in process chamber 1 and decomposing the gas supplied from shower head 2; and a substrate (not shown) on which the gas decomposed by catalyst wire structure 3 is deposited by sublimation.

Showerhead 2 is provided in process chamber 1 and effuses process gas. The process gas effused from showerhead 2 is decomposed into a material required in catalyst wire structure 3 according to an embodiment of the present invention, and then deposited on the substrate held by substrate holder 4. With this configuration, gas inlet line 350 of catalyst wire structure 3 penetrates the wall of process chamber 1, and is exposed to the atmosphere, wherein the gas is supplied from a gas source (not shown) located in the atmosphere on the exterior of chamber 1. Furthermore, catalyst wire structure 3 receives electric power from power supply unit 35 placed in the atmosphere through cable 32 penetrating the wall of process chamber 1.

By way of example, in the case where a silicon thin film is deposited, operations of the CECVD apparatus according to an embodiment of the present invention will be described below with reference to FIG. 10.

After chamber 1 exhausted by discharge system 1, $SiH_4$ gas is effused toward substrate 4 through showerhead 2 in order to deposit the silicon thin film on substrate 4. Catalyst wire 30 after previously being heated by power supply unit 35, tends to sag due to thermal expansion. At this point, the plurality of tensioners 300 supported by frame 31 and connecting catalyst wire 30 applies tension to each connected catalyst wire 30 through piston unit 330 and elastic member 320 in reaction to the inward movement of piston unit 330. The tension, i.e., the elasticity of elastic member 320, may vary according to processes, processing condition, the material of catalyst wire 30, the size of chamber 1, etc. For example, the tension, i.e., the elasticity of elastic member 302, is set to have an allowable value as long as it does not damage catalyst wire 30. Therefore, the tension applied by tensioners 300 prevents catalyst wire 30 from sagging as shown in FIG. 3.

Furthermore, the hydrogen $H_2$ gas is supplied from gas inlet line 350 and passes through gas supply lines 358, 318 and 338 in sequence. $H_2$ gas is effused from the free end of piston shaft 334 toward catalyst wire 30, and evenly supplied to the whole region of catalyst wire 30. Thus, the supplied H2 gas prevents a foreign material from being formed on catalyst wire 30 as the temperature is lowered due to unavoidable heat loss in the connection region between catalyst wire 30 and tensioners 300.

A CECVD method practiced as an embodiment of the principles of the present invention will be described below.

First, the process chamber is exhausted in an exhausting step. In general, during an exhaust step, process chamber 1 is exhausted by discharge system 11. Then, the process gas is introduced into the exhausted process chamber 1 in a process starting step, decomposed by reacting with the catalyst wire 30 in a catalyst wire operating step, and deposited on the exposed surface of the substrate held in the process chamber by holder 4, thereby growing a film on the exposed surface of that substrate.

In this regard, the process chamber is the CECVD apparatus employing a catalyst wire structure constructed as an embodiment of the present invention.

Furthermore, a purging step may be performed before the process starting step so as to purge the process chamber. In the purging step, gas such as hydrogen gas is introduced in the state to cause catalyst wire 30 to be heated, so that the process chamber and the catalyst wire are purged. Through the purging step, impurities are prevented from being injected into the thin film due to a foreign material generated in an actual process.

While the processes are performed, the catalyst wire is heated. At this point, the catalyst wire is expanded by the thermal expansion, and thus sags down within frame 31. According to an embodiment of the present invention, the tensioners of the catalyst wire structure apply tension to the sagging catalyst wire 30.

In this regard, even though the catalyst wire is stretched and extended while being hold under the tension applied, the catalyst wire will remain under tension while in an equilibrium state. Likewise, even though the catalyst wire is stretched farther, the catalyst wire is always tensed in an equilibrium state by the foregoing operation.

The forgoing operation is achieved by the catalyst wire structure of the CECVD apparatus and, more particularly, by the tensioners of the catalyst wire structure.

At the connecting region between the catalyst wire and the tensioners, heat loss is generated due to heat transfer between the heated catalyst wire and the non-heated tensioners, so that a foreign material is likely to be formed on the connection portion of the catalyst wire. To prevent the foreign material from being formed on the connection portion, additional gas may be supplied to the connecting region between the catalyst wire and the tensioners. The additional gas can be supplied through a gas supply line provided in the catalyst wire structure, of which configuration, device and effect is the same as described above.

As described in the foregoing paragraphs, the present invention provides a CECVD apparatus and a deposition method using the same, in which tension is applied to a catalyst wire in order to prevent the catalyst wire from sagging due to thermal deformation, and additional gas may be used to prevent foreign material from being generated, so that occurrence of non-uniform temperature of a substrate and concomitant non-uniform film growth are eliminated, and the durability and longevity of the catalyst wire is enhanced.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A catalyst-enhanced chemical vapor deposition apparatus, comprising:
    a vacuum process chamber;
    a showerhead disposed in the process chamber to introduce process gas into a vacuum within the process chamber;
    a tensile catalyst wire structure disposed in the process chamber, with the tensile catalyst wire structure comprising:
        a frame;
        a first plurality of tensioners formed on a first side of the frame;
        a second plurality of tensioners formed on a second and opposite side of the frame;
        a catalyst wire strung between the first and second pluralities of tensioners, with each one of the first and second pluralities of tensioners comprising a piston linearly aligned at a turn of the catalyst wire extending between the opposite sides of the frame to reciprocate with different corresponding lengths of the catalyst wire and applying tension to the catalyst wire while the catalyst wire is decomposing the process gas introduced from the showerhead, the piston comprising a piston shaft and a gas supply line disposed throughout the piston and the piston shaft and extending in parallel with an axial extending direction of the piston and the piston shaft; and
    a substrate on which the gas decomposed by the catalyst wire structure is deposited.

2. The catalyst-enhanced chemical vapor deposition apparatus according to claim 1, wherein the catalyst wire structure further comprises a power supply unit supplying electric power to the catalyst wire.

3. The catalyst-enhanced chemical vapor deposition apparatus according to claim 2, wherein the power supply unit comprises:
    a power source;
    a cable supplying the electric power is supplied from the power source; and
    a terminal connecting the cable with the catalyst wire.

4. The catalyst-enhanced chemical vapor deposition apparatus according to claim 3, wherein the terminal is mounted on the frame.

5. The catalyst-enhanced chemical vapor deposition apparatus according to claim 4, wherein the terminal comprises an electrically insulating material.

6. The catalyst-enhanced chemical vapor deposition apparatus according to claim 2, wherein the frame further comprises a gas inlet and a gas supply line to conduct the supply gas to the catalyst wire.

7. The catalyst-enhanced chemical vapor deposition apparatus according to claim 2, wherein:
    the frame is a rectangular-shaped frame;
    two connection terminals of the power supply unit are formed on a first side of the frame;
    a plurality of tensioners and the two connection terminals are formed on the first side of the frame, with the plurality of tensioners disposed between the two connection terminals; and
    a plurality of tensioners are formed on a second side of the frame, which is opposite to the first side of the frame.

8. The catalyst-enhanced chemical vapor deposition apparatus according to claim 7, wherein the catalyst wire extends from a first connection terminal of the power supply unit, being sequentially strung to one pair of neighboring tensioners on one side of the frame, and then to another pair of neighboring tensioners on the opposite side of the frame, until the catalyst wire reaches a second connection terminal of the power supply unit, and forms a rectangular S-shape.

9. The apparatus of claim 1, comprised of at least one of said tensioners disposed to introduce additional gas into the chamber via orifices formed in the tensioners and axially aligned with corresponding lengths of the catalyst wire.

10. A catalyst-enhanced chemical vapor deposition apparatus, comprising:
    a vacuum process chamber;
    a showerhead disposed in the process chamber to introduce process gas into a vacuum within the process chamber;
    a tensile catalyst wire structure disposed in the process chamber, with the tensile catalyst wire structure comprising:
    first and second pluralities of tensioners respectively disposed on opposite sides of a frame;
    a catalyst wire extending between the first and second pluralities of tensioners that are applying tension to the catalyst wire while the catalyst wire is decomposing the process gas introduced from the showerhead; and
    a power supply unit supplying electric power to the catalyst wire; and
    a substrate on which the gas decomposed by the catalyst wire structure is deposited, with each of the tensioners comprising:

a main body supported by the frame;

a piston reciprocatingly accommodated in the main body with a distal end of the piston connected to the catalyst wire, and the piston comprising a piston shaft and a gas supply line disposed throughout the piston and the piston shaft and extending in parallel with an axial extending direction of the piston and the piston shaft, the distal end of the piston being perforated in a direction perpendicular to the axial extending direction of the piston to form a through hole, and the catalyst wire passing through the through hole with a bend at the contact point between the piston and the catalyst wire; and an elastic member held by the main body applying tension to the piston.

11. The catalyst-enhanced chemical vapor deposition apparatus according to claim 10, wherein the main body and the frame are formed as a single body.

12. The catalyst-enhanced chemical vapor deposition apparatus according to claim 10, wherein the main body is hollow with a step restraining reciprocation of the piston.

13. The catalyst-enhanced chemical vapor deposition apparatus according to claim 10, wherein the main body includes an electrically insulating material.

14. The catalyst-enhanced chemical vapor deposition apparatus according to claim 10, wherein at a point of contact with the catalyst wire, the through hole formed in the piston is selectively tapered or rounded.

15. The catalyst-enhanced chemical vapor deposition apparatus according to claim 10, wherein the elastic member comprises a spring held in compression by said main body.

16. The apparatus of claim 10, comprised of at least one of said tensioners disposed to introduce additional gas into the chamber via orifices formed in the tensioners and axially aligned with corresponding lengths of the catalyst wire.

17. A catalyst-enhanced chemical vapor deposition method, comprising the steps of:

creating a vacuum by exhausting a process chamber;

introducing process gas into the exhausted process chamber;

exposing a catalyst wire to reaction with the process gas, with the catalyst wire being connected with first and second pluralities of tensioners respectively disposed on opposite sides of a rectangular frame, and each of the plurality of tensioners comprising:

a main body supported by the frame;

a piston accommodated in the main body with a distal end of the piston connected to the catalyst wire, with the piston being linearly aligned to reciprocate with the catalyst wire, the piston comprising a piston shaft and a gas supply line disposed throughout the piston and the piston shaft and extending in parallel with an axial extending direction of the piston and the piston shaft; and an elastic member held by the main body applying tension to the piston;

supplying additional gas to the catalyst wire via the gas supply line; and depositing precipitants of the reaction between the process gas and the catalyst wire on a substrate located within the process chamber, while the first and second pluralities of tensioners apply tension to the catalyst wire.

18. The catalyst-enhanced chemical vapor deposition method according to claim 17, wherein the process chamber comprises a catalyst-enhanced chemical vapor deposition apparatus deploying the catalyst in a catalyst wire structure.

19. The catalyst-enhanced chemical vapor deposition method according to claim 17, further comprised of purging the process chamber before introducing the process gas.

20. The catalyst-enhanced chemical vapor deposition method according to claim 17, comprised of causing said reaction by:

heating the catalyst wire;

expanding the heated catalyst wire; and applying tension to the expanded catalyst wire.

21. The catalyst-enhanced chemical vapor deposition method according to claim 20, wherein the tension is applied to the expanded catalyst wire by:

stringing the catalyst wire between a plurality of discrete tensioners mounted on opposite sides of said frame; and maintaining the tensioners under tension.

22. The catalyst-enhanced chemical vapor deposition method according to claim 21, comprised of applying the tension by stringing the catalyst wire between a plurality of tensioners held under tension on opposite sides of a frame.

23. The catalyst-enhanced chemical vapor deposition method according to claim 21, comprised of supplying additional gas to the catalyst wire via a gas supply line discharging the additional gas through the tensioners.

24. The catalyst-enhanced chemical vapor deposition method according to claim 20, comprised of supplying additional gas to the catalyst wire during said reaction.

25. The method of claim 17, comprised of introducing additional gas into the process chamber via orifices formed in the tensioners in axial alignment with corresponding lengths of the catalyst wire.

26. A catalyst-enhanced chemical vapor deposition method, comprising the steps of:

stringing a catalyst wire between first and second pluralities of tensioners reciprocatingly held under tension on opposite sides of a frame centrally positioned within a process chamber;

directing a process gas introduced into a vacuum of the process chamber to flow across the catalyst wire; and exposing a surface of a substrate to deposition of sublimate from a reaction of the process gas and the catalyst wire, while the first and second plurality of tensioners apply tension to the catalyst wire, with each of the plurality of tensioners comprising:

a main body supported by the frame;

a piston accommodated in the main body with a distal end of the piston connected to the catalyst wire, with the piston being linearly aligned to reciprocate with a majority of a length of the catalyst wire, and the piston comprising a piston shaft and a gas supply line disposed throughout the piston and the piston shaft and extending in parallel with an axial extending direction of the piston and the piston shaft; and an elastic member held by the main body applying tension to the piston.

27. The catalyst-enhanced vapor deposition method of claim 26, comprised of introducing additional process gas into the chamber via orifices formed in distal portions of the tensioners, with the additional process gas being supplied in a direction in axial alignment with corresponding lengths of the catalyst wire.

* * * * *